(12) United States Patent
Kim

(10) Patent No.: US 7,340,653 B2
(45) Date of Patent: Mar. 4, 2008

(54) METHOD FOR TESTING A MEMORY DEVICE

(75) Inventor: Tae Yun Kim, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 552 days.

(21) Appl. No.: 10/871,423

(22) Filed: Jun. 18, 2004

(65) Prior Publication Data

US 2004/0257850 A1 Dec. 23, 2004

(30) Foreign Application Priority Data

Jun. 20, 2003 (KR) ............... 10-2003-0040243

(51) Int. Cl.
*G06F 11/00* (2006.01)
(52) U.S. Cl. ............... 714/42; 714/5; 714/42; 714/718
(58) Field of Classification Search ............ 714/5, 714/42, 718
See application file for complete search history.

(56) References Cited

U.S. PATENT DOCUMENTS

| 5,471,430 | A | 11/1995 | Sawada et al. |
| 5,905,690 | A | 5/1999 | Sakurai et al. |
| 6,061,285 | A | 5/2000 | Tsukikawa |
| 6,530,045 | B1 | 3/2003 | Cooper et al. |
| 6,532,184 | B2 | 3/2003 | Chun |
| 6,559,669 | B2 | 5/2003 | Sugamoto et al. |
| 6,563,760 | B2 | 5/2003 | Song |
| 7,057,950 | B2 * | 6/2006 | Lee ..................... 365/203 |
| 2001/0017805 | A1 * | 8/2001 | Jang et al. .............. 365/202 |
| 2002/0163850 | A1 | 11/2002 | Song |
| 2002/0167859 | A1 | 11/2002 | Chun |
| 2003/0117882 | A1 | 6/2003 | Kim |
| 2003/0140290 | A1 | 7/2003 | Sugamoto et al. |

FOREIGN PATENT DOCUMENTS

| JP | 05-74200 | 3/1993 |
| JP | 10-21150 | 1/1998 |
| JP | 11-149771 | 6/1999 |

* cited by examiner

Primary Examiner—Robert Beausoliel
Assistant Examiner—Charles Ehne
(74) Attorney, Agent, or Firm—Ladas & Parry LLP

(57) ABSTRACT

Disclosed is a method for testing a memory device with a long-term clock signal by automatically performing precharge only after activation. In this method, a signal for precharging the banks of the memory device is automatically generated only at the falling edge of an external signal when a signal for activating the banks is applied. Accordingly, the present invention ensures a stable test of the memory device, reducing the testing time.

10 Claims, 7 Drawing Sheets

METHOD FOR TESTING A MEMORY DEVICE

BACKGROUND OF THE INVENTION

1. Field of the Invention

The present invention relates to a method for testing a memory device, and more particularly to a method for testing a memory device with a long-term clock signal by automatically performing a precharge only after activation.

2. Description of the Prior Art

As generally known in the art, memory devices are subjected to stringent tests under particular conditions before being released as end products. One of such tests is a burn-in test performed on memory devices in a wafer level under more severe conditions than those which will actually be applied to the devices. The burn-in test applies a higher voltage at a higher temperature to detect any flaw in memory chips before being supplied to end-users and thereby ensure reliability and productivity of memory devices.

The burn-in test on memory devices is performed using a burn-in system. As the operation frequency of memory devices increases, new burn-in systems need to be purchased to test the devices in the prior art, thereby resulting in the increase of expenses for testing.

In order to solve this cost problem, in the prior art, memory devices operating at a high frequency have been tested using a system operating at a low frequency. Such a test generally requires a test mode of a long-term clock (a low-frequency clock) "tm_ltck".

The general operation of a memory device will be described in detail with reference to FIG. 1.

FIG. 1 is a timing diagram showing activation and precharge of a memory device (for example, SDRAM) when it properly operates.

Referring to FIG. 1. CLK is an external clock signal. tCLK refers to a cycle of CLK. CMD refers to a command signal. ACT refers to an activation command, while PCG refers to a precharge command. tm_ltck is an abbreviation for test mode_long term clock, which refers to a test mode of a long-term clock signal. atvp is an abbreviation for active pulse, which refers to a pulse signal generated in accordance with an ACT command to execute the activation command. pcgp stands for a precharge pulse which is a pulse signal generated in accordance with a PCG command to execute the precharge command.

As shown in FIG. 1, when tm_ltck is at a low level, i.e., when the test mode using a long-term clock is disabled, the memory device generates an atvp signal for activating the memory device in response to an ACT command signal and a pcgp signal for precharging the memory device in response to a PCG command signal. As explained above, however, when a burn-in system driving at a low frequency is used, a high frequency memory device should be tested in a test mode of a long-term clock signal.

FIG. 2 is a timing diagram showing activation and precharge in the test mode of a long-term clock signal.

As shown in FIG. 2, CLK outputted from a burn-in system operating at a low frequency is used in a test mode where tm_ltck is at a high level.

When an ACT command is applied at the rising edge of a long-term clock signal (long tCK), the memory device generates an atvp signal for performing low activation. Subsequently, the memory device automatically generates a pcgp signal at the falling edge of the long-term clock signal to perform a precharge operation.

A high-level activation of tm_ltck will be explained in detail with reference to FIG. 2.

When an activation command is applied at the rising edge of an external clock signal 1, an atvp signal within the memory device is activated to perform low activation. After lapse of the time period tRAS, a pcgp signal within the memory device is activated to automatically perform precharge at the falling edge of the external clock signal 1. Accordingly, another activation command can be applied at the rising edge of an external clock signal 2. In other words, it is possible to perform a burn-in test on a memory device using a system operating at a low frequency within a reduced testing time.

A low-level activation of tm_ltck will now be explained.

When an activation command is applied at the rising edge of the external clock signal 1, an atvp signal within the memory device is activated to perform low activation. After lapse of the time period tRAS, a precharge command is applied at the rising edge of the external clock signal 2 to activate a pcgp signal within the memory device and perform precharge. Subsequently, another command, for example, an activation command, is applied at the rising edge of an external clock signal 3. It is required to reduce tCK to minimize tRAS while testing the memory device using a system operating at a low frequency. In this case, the overall testing time cannot be reduced.

As shown in FIG. 2, when a long-term clock signal is applied to test a memory device, it is synchronized with the falling edge of an external clock signal to automatically perform a precharge operation, without applying a separate precharge command.

However, such an automatic precharge may cause problems as shown in FIG. 3.

FIG. 3 is a timing diagram showing activation and precharge operations in the test mode of a long-term clock signal in the prior art. According to the prior art, even when a precharge is not required, a long-term clock signal is synchronized with the falling edge of an external clock signal to automatically perform precharge.

Since a precharge is automatically performed at the falling edge of the external clock CLK even in an operation which does not require a precharge, such as an MRS (mode register set) or EMRS (extended mode register set) operation, after entry into the tm_ltck test mode (i.e., tm_ltck=high level), there is a likelihood of improper operation or unstable test mode operation, which will lower the reliability of the test results.

SUMMARY OF THE INVENTION

Accordingly, the present invention has been made to solve the above-mentioned problems occurring in the prior art, and an object of the present invention is to provide a method for testing a memory device by performing a precharge only if required.

In order to accomplish this object, there is provided a method for testing a memory device by performing precharge at the falling edge of an external clock signal CLK, only when an activation command is applied at the rising edge of the external clock signal CLK to perform low activation.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
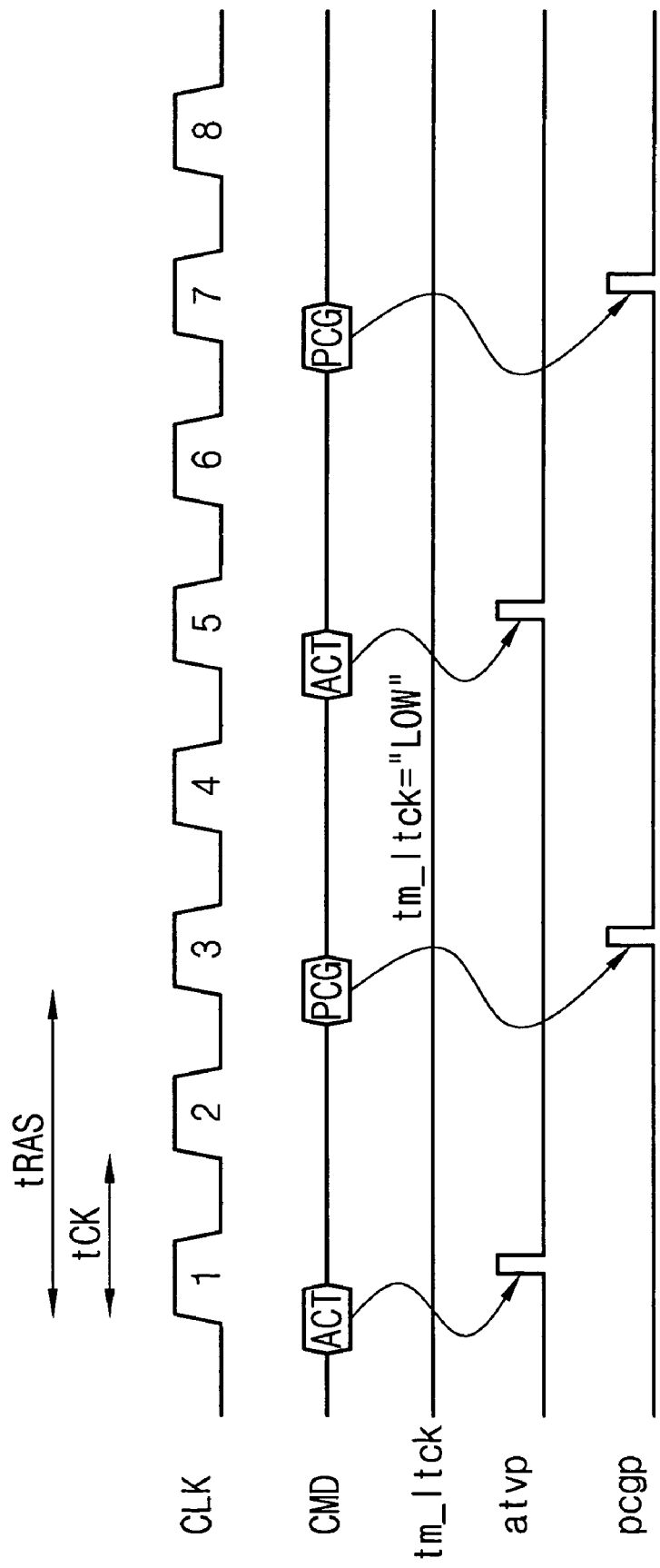
FIG. 1 is a timing diagram showing activation and precharge operations according to the prior art, when a memory device properly operates.
Figure 2:
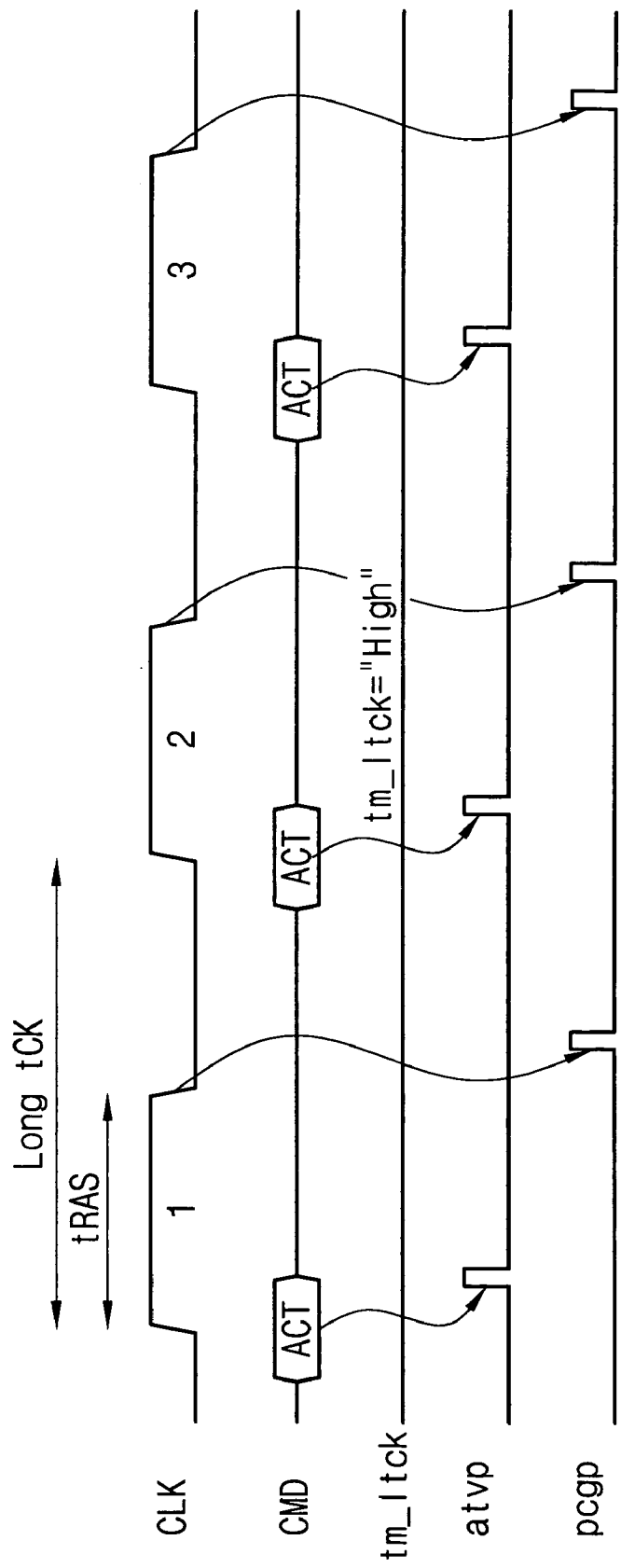
FIG. 2 is a timing diagram showing activation and precharge operations in a test mode of a long-term clock signal according to the prior art.
Figure 3:
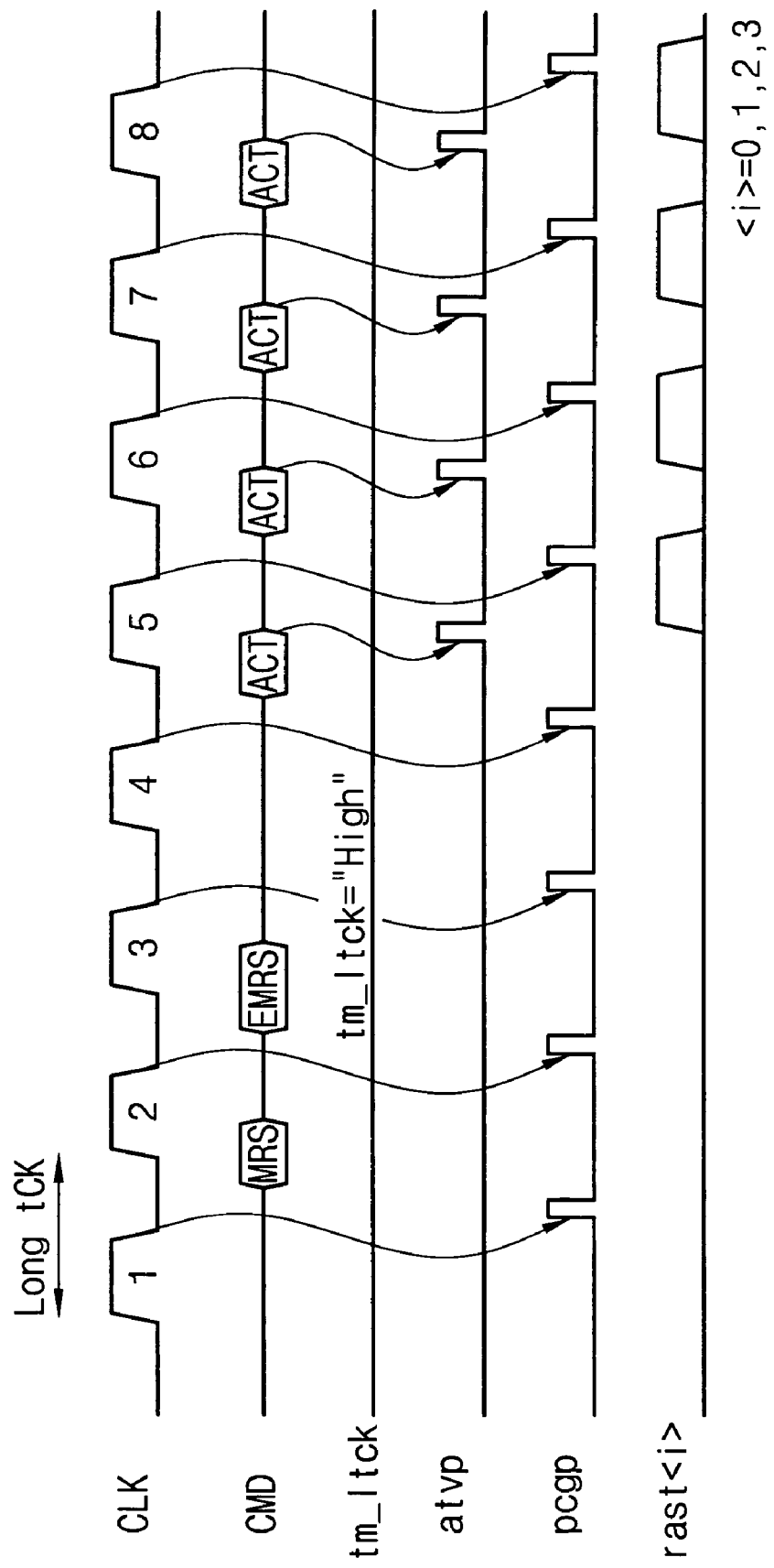
FIG. 3 is a timing diagram showing activation and precharge operations in a test mode of a long-term clock signal according to the prior art.

Hereinafter, preferred embodiments of the present invention will be described with reference to the accompanying drawings. In the following description and drawings, the same reference numerals are used to designate the same or similar components, and so repetition of the description on the same or similar components will be omitted.

A first embodiment of the present invention provides a method for testing a memory device, comprising the steps of: applying an external clock to the memory device; applying a command signal for controlling the operation of the memory device; generating a first pulse signal corresponding to the command signal; and applying a test mode signal for testing the memory device. If the test mode is a first level, banks of the memory device are precharged only when the command signal is a precharge command signal. If the test mode is at a second level, the precharge operation of the banks is automatically performed even when the command signal is not a precharge command signal.

In the second level test mode, the precharge operation is automatically performed when a predetermined period of time lapses after application of an activation command signal for activating the banks of the memory device.

Also, in the second level test mode, the precharge operation is triggered by a second pulse signal generated in synchronization with the falling edge of the external clock.

In the first embodiment of the present invention, if the test mode is at the first level, the precharge operation is triggered by a second pulse signal generated in synchronization with the falling edge of the external clock.

A second embodiment of the present invention provides a method for testing a memory device having a plurality of banks, comprising the steps of: applying an external clock to the memory device; and applying a command signal for controlling the operation of the memory device. If a test mode signal for the memory device is deactivated, precharge of the plurality of banks is performed only when the command signal is a precharge command. If the test mode signal is activated, precharge of the banks is automatically performed when a predetermined period time lapses after application of an activation command signal for activating the banks.

According an embodiment of the present invention, a signal for precharging the banks of the memory device is automatically generated only at the falling edge of an external clock signal when a signal for activating the banks is applied.

When a signal for activating the banks of the memory device is not applied, the precharge operation is not performed at the falling edge of the external clock signal.

According an embodiment of the present invention, a signal representing low activation of the banks is activated by the application of an activation command at the rising edge of the external clock signal, and deactivated by the automatic precharge at the falling edge of the external clock signal.

The external clock is a long-term clock signal having a frequency lower than the operation frequency of the memory device. The long-term clock signal is outputted from the system for testing the memory device and applied to the memory device.

The method for testing a memory device according to the present invention automatically generates a signal for precharging the banks of the memory device only when a signal for activating the banks is applied.

The preferred embodiments of the present invention will be described in further detail with reference to the accompanying drawings.

Figure 4:
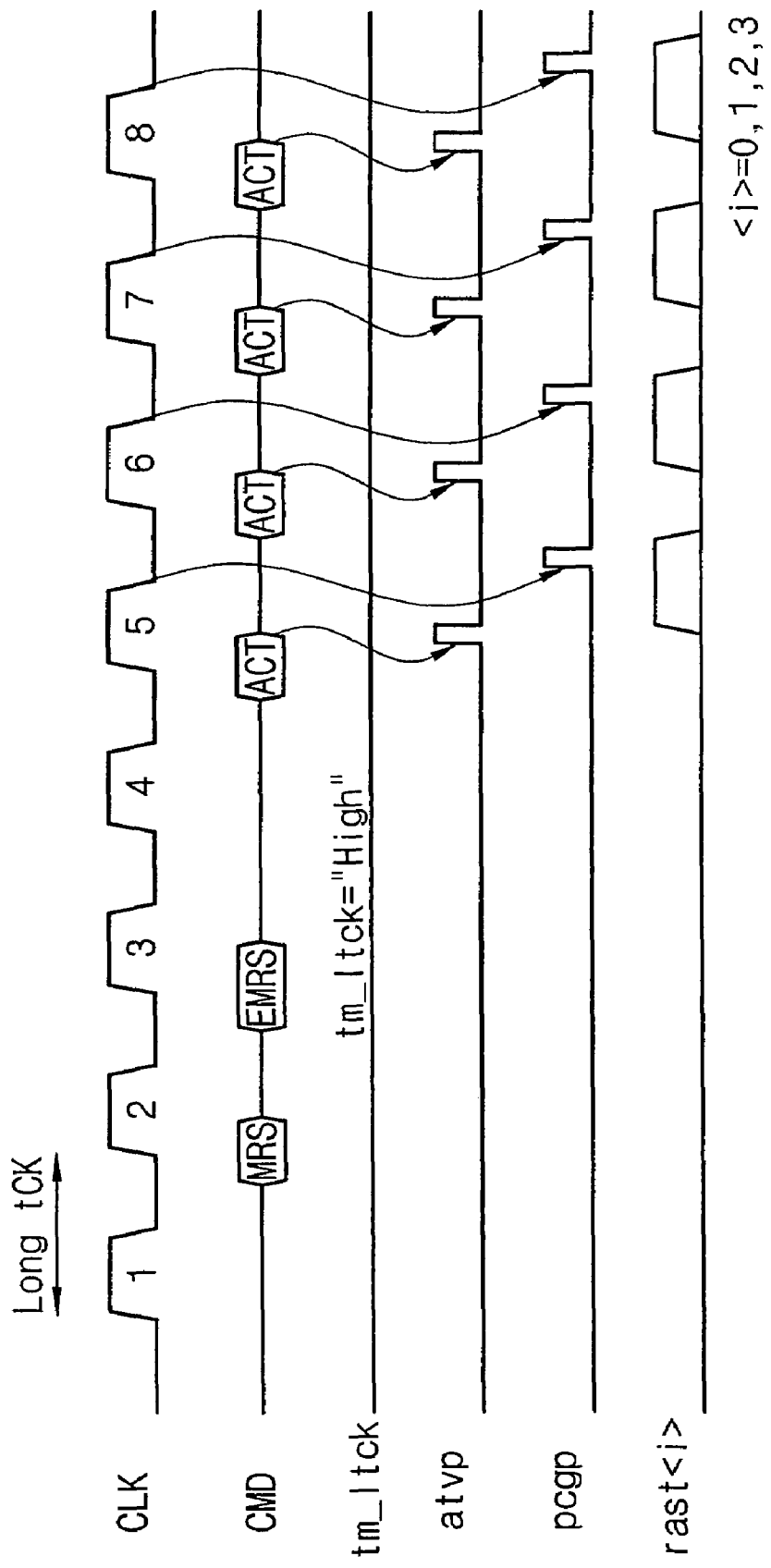
FIG. 4 is a timing diagram showing activation and precharge operations in a test mode of a long-term clock signal according to the present invention.

FIG. 4 is a timing diagram showing activation and precharge operations in a test mode of a long-term clock signal according to the present invention. In FIG. 4, rast<i>, wherein i is 0, 1, 2 and 3, represents a signal showing low activation state of each bank of the memory device (having four banks). For example, rast<1> shows low activation state of a bank 1 (not shown).

As shown in FIG. 4, after entry into tm_ltck test mode, precharge is automatically performed at the falling edge of a clock signal only when an ACT command signal is applied. In other words, when a signal, such as MRS or EMRS, is applied, precharge is not performed at the falling edge of the clock.

In the method for testing a memory device according to an embodiment of the present invention, precharge is not performed at the falling edge of an external clock, if not required. The precharge operation is automatically performed in synchronization with the falling edge of an external clock signal only when an activation command is applied.

Figure 5:
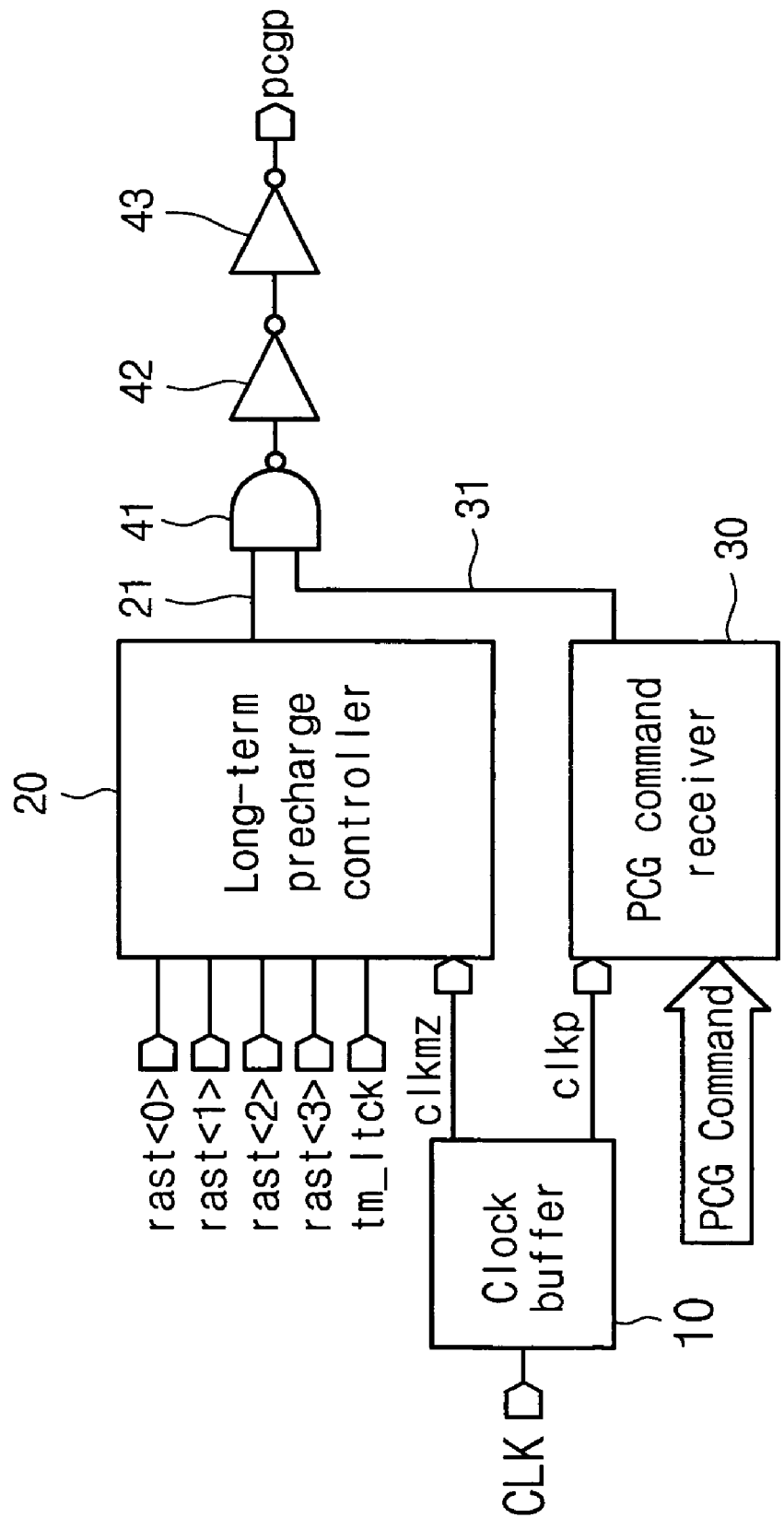
FIG. 5 shows an example of a precharge pulse signal generator for performing precharge only upon activation.

FIG. 5 shows an example of a precharge pulse signal (pcgp) generator for performing precharge only upon activation.

The precharge pulse signal generator according to the present invention comprises a clock buffer 10, a long-term clock precharge controller 20 and a precharge command (PCG command) receiver 30.

Figure 6:
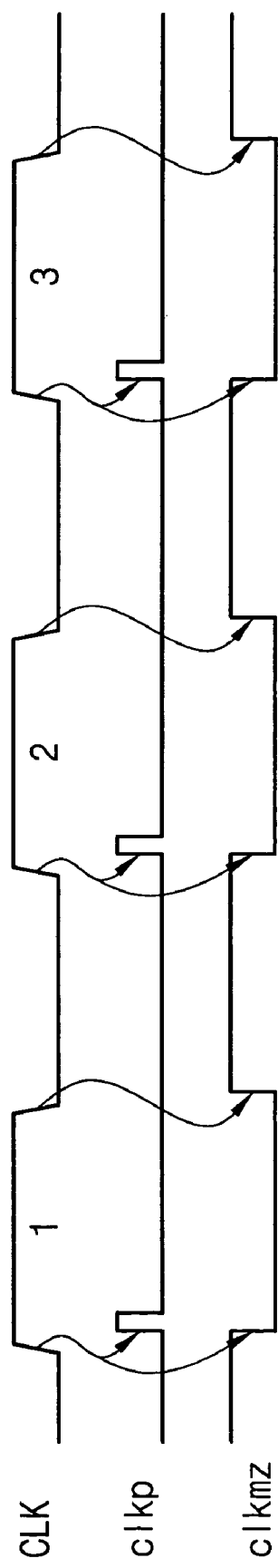
FIG. 6 are waveforms of an external clock signal and internal clock signals.

The clock buffer 10 receives an external clock signal CLK and generates internal clocks clkmz and clkp to be used within the memory clock. FIG. 6 are waveforms of the external clock signal CLK and the internal clock signals clkmz and clkp. As shown in FIG. 6, one internal clock signal clkp is a pulse signal generated in synchronization with the rising edge of the external clock signal CLK, while the other internal clock signal clkmz is a signal responding in the opposite phase to the external clock signal CLK.

Figure 7:
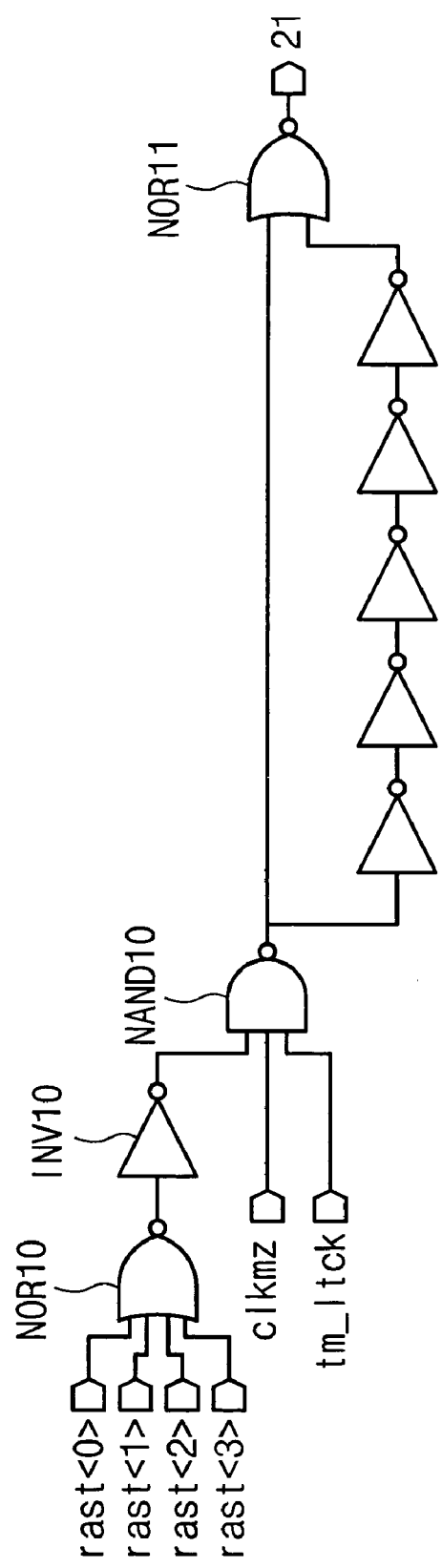
FIG. 7 shows an example of a long-term clock precharge controller.

The long-term clock precharge controller 20 receives rast<0>, rast<1>, rast<2> and rast<3> signals, a test mode signal tm_ltck and an internal clock clkmz. An example of a circuit of the long-term clock precharge controller 20 is illustrated in FIG. 7. The long-term clock precharge controller 20 includes: an NOR gate NOR10 for receiving rast<0>, rast<1>, rast<2> and rast<3> signals; an inverter INV10 for inverting an output signal from the NOR gate NOR10; an NAND gate NAND10 for receiving an output signal from the inverter INV10, an internal clock signal clkmz and a test mode signal tm_ltck; and an NOR gate NOR11 for receiving an output signal from the NAND gate NAND10 and a signal delayed from said output signal from the NAND gate NAND10 during a predetermined delay time through an inverter chain.

The precharge command receiver 30 receives and enables a PCG signal. When a normal precharge command signal PCG is applied from outside, the precharge command receiver 30 generates a precharge pulse signal pcgp, which activates precharge, in accordance with the internal clock signal clkp.

An output signal 21 from the long-term clock precharge controller 20 and an output signal 31 from the precharge command receiver 30 are applied to an NAND gate 41. The NAND gate 41 outputs an end output signal pcgp through inverters 42 and 43.

Figure 8:
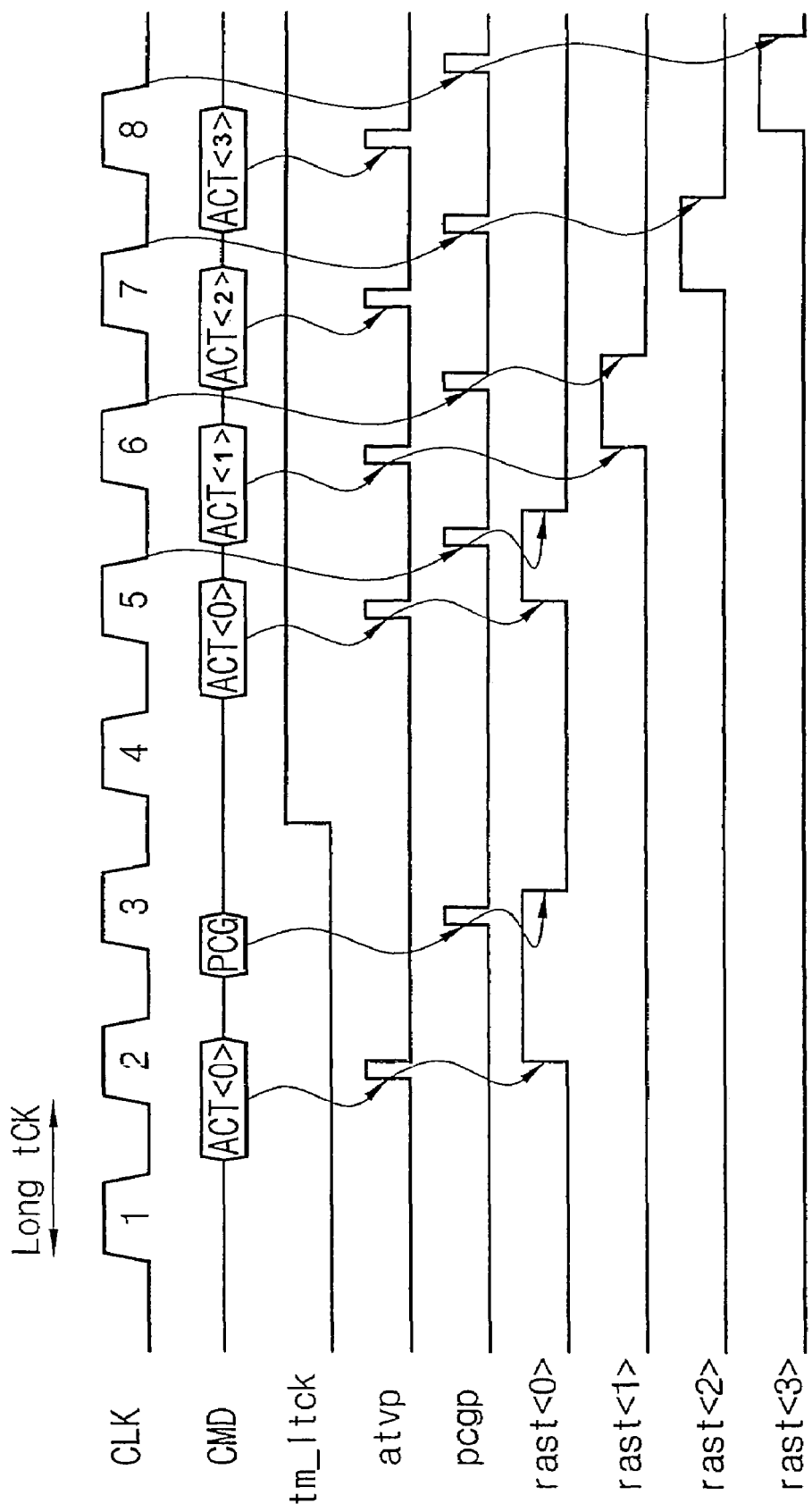
FIG. 8 are waveforms showing a process of generating a precharge signal in a method for testing a memory device according to the present invention.

FIG. 8 are waveforms showing a process of generating a precharge signal in a method for testing a memory device according to the present invention.

A first case in which a test mode signal tm_ltck is deactivated (that is, tm_ltck=low level) in the test mode of a long-term clock signal will be described in detail with reference to FIG. 8.

In the first case, even when an activation command (ACT<0>) is applied at the rising edge of an external clock signal CLK to perform low activation, no precharge is performed at the falling edge of the external clock signal.

Further, a second case in which a test mode signal tm_ltck is activated (that is, tm_ltck=high level) in the test mode of long-term clock signal will be described in detail with reference to FIG. 8.

In the second case, when an activation command (ACT<0>, ACT<1>, ACT<2> and ACT<3>) is applied at the rising edge of an external clock signal CLK to perform low activation, precharge is automatically performed at the falling edge of the external clock signal.

Also, the signals rast<0>, rast<1>, rast<2> and rast<3> showing low activation of the activated banks are activated by the application of an activation command at the rising edge of an external clock signal, and deactivated by the automatic precharge at the falling edge of the external clock signal.

The preferred embodiment of the present invention will be described in more detail with reference to FIGS. 5 to 8.

A precharge operation occurring when a tm_ltck signal is deactivated will be explained.

Referring to FIGS. 5 to 7, when a PCG command is applied at the rising edge of an external clock signal CLK in accordance with a normal precharge command from outside, the PCG command receiver 30 outputs a predetermined pulse signal to the output line 31 in accordance with an internal clock signal clkp. Since the tm_ltck signal is deactivated, the output line 21 of the long-term clock precharge controller 20 is maintained in deactivated state. While the output line 21 is being deactivated, the output line 31 is in activated state. Accordingly, the end output signal pcgp is activated to perform a normal precharge operation.

A precharge operation when the tm_ltck signal is activated will be explained.

If activation is not performed even when the tm_ltck signal is activated, the signals rast<0>, rast<1>, rast<2> and rast<3> showing low activation of the banks of the memory device will be in deactivated state, and no precharge command will be applied. Therefore, the output lines 21 and 31 will be maintained in deactivated state. In this case, the end output signal pcgp will not be activated. In other words, if activation is not performed even when the tm_ltck signal is activated, precharge will not be performed at the falling edge of an external clock signal CLK.

If low activation is performed in at least one bank by the application of an activation command at the rising edge of an external clock signal CLK while a tm_ltck signal is activated, at least one of the signals rast<0>, rast<1>, rast<2> and rast<3> showing low activation of the banks will be activated. As shown in FIG. 8, the signals rast<0>, rast<1>, rast<2> and rast<3> are activated when an activation command is applied with respect to the corresponding bank or banks, and deactivated by a pcgp signal showing a precharge operation. At the falling edge of the external clock signal CLK when an activation command is applied, a signal outputted to the output line 21 is activated by the internal clock signal clkmz having a phase opposite to the external clock signal CLK. Therefore, the output signal pcgp is automatically activated, regardless of a voltage of the output line 31 in the deactivated state.

As described above, the present invention performs precharge at the falling edge of an external clock signal only when an activation command is applied at the rising edge of the external clock signal to perform low activation. Accordingly, the present invention ensures a stable test of a memory device, reducing the testing time.

Although preferred embodiments of the present invention have been described for illustrative purposes, those skilled in the art will appreciate that various modifications, additions and substitutions are possible, without departing from the scope and spirit of the invention as disclosed in

What is claimed is:

1. A method for testing a memory device, comprising the steps of:

applying an external clock to a circuit coupled to the memory device;

applying an activation command to the circuit, applying a precharge command to the circuit;

applying a test mode command to the circuit;

generating an activation pulse from the circuit to memory banks of the memory device in synchronization to a rising edge of the external clock after applying the activation command when the test mode command is at a first level;

generating a precharge pulse from the circuit to the memory banks in synchronization to a falling edge of the external clock after applying the activation and precharge commands when the test mode command is at the first level;

generating the activation pulse from the circuit to the memory banks in synchronization to the rising edge of the external clock after applying the activation command when the test mode command is at a second level;

generating the precharge pulse from the circuit to the memory banks in response to applying the activation command and in synchronization to the falling edge of the external clock when the test mode command is at the second level.

2. The method according to claim 1, wherein when the test mode command is at the second level, the generation of the precharge pulse is automatically performed after a predetermined time period subsequent to the applying step of the activation command.

3. The method according to claim 2, wherein when the test mode is at the second level, the generation of the precharge pulse operation is triggered in synchronization with the falling edge of said external clock.

4. The method according to claim 1, wherein when the test mode is at the first level, the generation of the precharge pulse is triggered in synchronization with the falling edge of the external clock.

5. A method for testing a memory device having a plurality of banks, comprising the steps of:
   applying an external clock to a circuit coupled to the memory device;
   applying an activation command to the circuit;
   applying a precharge command to circuit;
   activating a test mode command to circuit;
   deactivating the test mode command to the memory device;
   generating an activation pulse from the circuit to memory banks of the memory device in synchronization to a rising edge of the external clock after applying the activation command when the test mode command is deactivated;
   generating a precharge pulse from the circuit to the memory banks in synchronization to a falling edge of the external clock after applying the activation and precharge commands when the test mode command is deactivated;
   generating the activation pulse from the circuit to the memory banks in synchronization to the rising edge of the external clock after applying the activation command when the test mode command is activated;
   generating the precharge pulse from the circuit to the memory banks in response to the applying the activation command and in synchronization to the falling edge of the external clock when the test mode command is activated.

6. A method for testing a memory device comprising the steps of:
   applying an external clock to a circuit coupled to the memory device;
   applying an activation command to the circuit;
   applying a precharge command to the circuit;
   applying a test mode command to the circuit;
   generating an activation pulse from the circuit to memory banks of the memory device in synchronization to a rising edge of the external clock after applying the activation command when the test mode command is at a first level;
   generating a precharge pulse from the circuit to the memory banks in synchronization to a falling edge of the external clock after applying the activation and precharge commands when the test mode command is the first level;
   generating the activation pulse from the circuit to the memory banks in synchronization to the rising edge of the external clock after applying the activation command when the test mode command is at a second level; and
   generating the precharge pulse from the circuit to the memory banks in response to the applying the activation command and in synchronization to a falling edge of the external clock when the test mode command is at the second level.

7. The method according to claim 6, wherein when the test mode command is at the second level the generation of the precharge pulse is not performed in response to the application of the precharge command.

8. The method according to claim 6, wherein the first level of the test mode command is low and the second level of the test mode command is high.

9. The method according to claim 6, wherein the external clock is a long-term clock signal having a frequency lower than the operation frequency of the memory device, and the long-term clock signal is outputted from a system for testing the memory device and applied to the memory device.

10. A method for testing a memory device by automatically precharging banks of a memory device said method comprising the steps of:
    applying an external clock to a circuit coupled to the memory device;
    applying an activation command to the circuit;
    applying a precharge command to the circuit;
    applying a test mode command to the circuit;
    generating an activation pulse from the circuit to memory banks of the memory device in synchronization to a falling edge of the external clock after applying the activation command when the test mode command is at a first level;
    generating a precharge pulse from the circuit to the memory banks in synchronization to a rising edge of the external clock after applying the activation and precharge commands when the test mode command is the first level;
    generating the activation pulse from the circuit to the memory banks in synchronization to the falling edge of the external clock after applying the activation command when the test mode command is at a second level; and
    generating the precharge pulse from the circuit to the memory banks in response to the applying the activation command and in synchronization to a rising edge of the external clock when the test mode command is at the second level.

* * * * *